(12) United States Patent
Zhang

(10) Patent No.: US 9,740,053 B2
(45) Date of Patent: Aug. 22, 2017

(54) ARRAY SUBSTRATE, FABRICATION METHOD THEREOF, AND DISPLAY DEVICE

(71) Applicants: BOE Technology Group Co., Ltd., Beijing (CN); Beijing BOE Optoelectronics Technology Co., Ltd., Beijing (CN)

(72) Inventor: Jiaxiang Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 121 days.

(21) Appl. No.: 14/386,592

(22) PCT Filed: Nov. 14, 2013

(86) PCT No.: PCT/CN2013/087156
§ 371 (c)(1),
(2) Date: Sep. 19, 2014

(87) PCT Pub. No.: WO2014/180111
PCT Pub. Date: Nov. 13, 2014

(65) Prior Publication Data
US 2016/0139443 A1    May 19, 2016

(30) Foreign Application Priority Data
May 7, 2013    (CN) .......................... 2013 1 0164803

(51) Int. Cl.
G02F 1/1335    (2006.01)
G02F 1/1339    (2006.01)
(Continued)

(52) U.S. Cl.
CPC ........ *G02F 1/13394* (2013.01); *G02F 1/1368* (2013.01); *H01L 27/1225* (2013.01); *H01L 27/1262* (2013.01); *H01L 29/7869* (2013.01)

(58) Field of Classification Search
None
See application file for complete search history.

(56) References Cited

U.S. PATENT DOCUMENTS

2005/0140858 A1    6/2005    Park
2007/0002259 A1*   1/2007    SangChul ......... G02F 1/133345
                                                                349/155
(Continued)

FOREIGN PATENT DOCUMENTS

CN    1888962 A    1/2007
CN    1940661 A    4/2007
(Continued)

OTHER PUBLICATIONS

International Search Report Appln. No. PCT/CN2013/087156; Dated Aug. 5, 2015.
(Continued)

*Primary Examiner* — Ali Naraghi
(74) *Attorney, Agent, or Firm* — Ladas & Parry LLP; Loren K. Thompson

(57) ABSTRACT

Embodiments of the disclosure provide an array substrate and a fabrication method thereof, and a display device. The array substrate includes: a base substrate and a switch unit disposed on the base substrate. The array substrate further includes: a passivation layer disposed on the base substrate and a spacer disposed on the passivation layer; and the spacer corresponds to the switch unit.

16 Claims, 4 Drawing Sheets

(51) Int. Cl.
*G02F 1/1368* (2006.01)
*H01L 27/12* (2006.01)
*H01L 29/786* (2006.01)

(56) References Cited

U.S. PATENT DOCUMENTS

| | | | |
|---|---|---|---|
| 2007/0070287 | A1 | 3/2007 | Lee et al. |
| 2007/0291217 | A1* | 12/2007 | Kang ............... G02F 1/136227 349/156 |
| 2009/0059110 | A1 | 3/2009 | Sasaki et al. |
| 2010/0118244 | A1 | 5/2010 | Lee et al. |
| 2013/0119408 | A1* | 5/2013 | Koyama ........... G02F 1/136286 257/79 |

FOREIGN PATENT DOCUMENTS

| | | |
|---|---|---|
| CN | 101382708 A | 3/2009 |
| CN | 101657755 A | 2/2010 |
| CN | 102346340 A | 2/2012 |
| KR | 20040059001 A | 7/2004 |

OTHER PUBLICATIONS

Written Opinion of the International Searching Authority Appln. No. PCT/CN2013/087156; Dated Feb. 27, 2014.
Second Chinese Office Action Appln. No. 201310164803.6, Dated Aug. 5, 2015.
International Search Report Appln. No. PCT/CN2013/087156; Dated Feb. 8, 2014.
International Preliminary Report on Patentability Appln. No. PCT/CN2013/087156; Dated Nov. 10, 2015.
First Chinese Office Action Appln. No. 201310164803.6; Dated Feb. 25, 2015.
Third Chinese Office Action Appln. No. 201310165803.6; Dated Dec. 30, 2015.

* cited by examiner

ARRAY SUBSTRATE, FABRICATION METHOD THEREOF, AND DISPLAY DEVICE

TECHNICAL FIELD

Embodiments of the disclosure relate to an array substrate and a fabrication method thereof, and a display device.

BACKGROUND

In a Thin Film Transistor-Liquid Crystal Display (TFT-LCD), a spacer is essential to maintain a cell thickness required by a liquid crystal layer.

Currently, the spacer is provided on an opposed substrate. The spacer having a predetermined height is formed by coating an organic resin layer on the opposed substrate and performing a patterning process on the resin layer. After assembling the array substrate and the opposed substrate, the spacer has its end portion in contact with the array substrate, and the contact position is at the highest portion of the array substrate. In the case that the array substrate is pressed, the spacer will slide to a lower portion and it is difficult for the spacer to return to its original position. Thus, a position deviation between the spacer and the array substrate is caused and light leakage occurs.

SUMMARY

In one aspect, embodiments of the disclosure provide an array substrate. The array substrate comprises: a base substrate and a switch unit disposed on the base substrate. The array substrate further comprises: a passivation layer disposed on the base substrate and a spacer disposed on the passivation layer; and the spacer corresponds to the switch unit.

For example, the passivation layer and the spacer are made of an organic resin material.

For example, the passivation layer and the spacer are formed integrally.

For example, the switch unit is a thin film transistor.

For example, the thin film transistor is of a bottom-gate type or a top-gate type.

For example, the array substrate further comprises a common electrode.

For example, the passivation layer covers the switch unit.

In another aspect, embodiments of the disclosure provide a display device, and the display device comprises the above-described array substrate.

In still another aspect, embodiments of the disclosure provide a method of fabricating an array substrate, the method comprising: forming a switch unit on a base substrate. The method further comprises: forming a passivation layer on the base substrate and forming a spacer corresponding to the switch unit.

For example, the passivation layer and the spacer are made of an organic resin material.

For example, the forming the passivation layer on the base substrate and forming the spacer corresponding to the switch unit comprises: forming a thin film made of a positive or negative organic resin material on the base substrate; exposing the thin film by using a gray-tone mask or a halftone mask, and performing a developing process to form the passivation layer covering the base substrate and the spacer corresponding to the switch unit.

For example, the switch unit is a thin film transistor.

For example, the thin film transistor is of a bottom-gate type or a top-gate type.

For example, the method further comprises: forming a common electrode on the base substrate.

For example, the passivation layer is formed to cover the switch unit.

BRIEF DESCRIPTION OF THE DRAWINGS

In order to clearly illustrate the technical solution in the embodiments of the disclosure or in the prior art, the drawings necessary for description of the embodiments or the prior art will be briefly described in the following; it is obvious that the described drawings are only related to some embodiments of the disclosure, from which one ordinarily skilled in the art still can obtain other drawings without inventive work.

DESCRIPTION OF THE EMBODIMENTS

Figure 1:
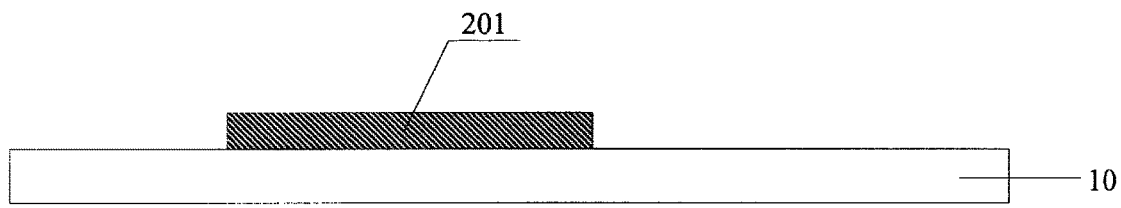
FIG. 1-FIG. 7 are schematic views illustrating a method of fabricating an array substrate according to embodiments of the disclosure.

The technical solutions according to embodiments of the disclosure will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the disclosure provide a method of fabricating an array substrate, and the method comprises forming a switch unit on a base substrate. The method further comprises: forming a passivation layer on the substrate, and forming a spacer corresponding to the switch unit.

For example, the switch unit is a Thin Film Transistor (TFT), and comprises: a gate electrode, a gate insulation layer, an active layer, a source electrode, a drain electrode and the like.

It should be noted that, the "spacer corresponding to the switch unit" as described herein means that the spacer is provided above the switch unit as viewed from a direction perpendicular to the array substrate.

Embodiments of the disclosure provide the method of fabricating the array substrate, the method comprising: forming the switch unit, forming the passivation layer, and forming the spacer corresponding to the switch unit on the base substrate. By forming the spacer on the array substrate, a position deviation between the spacer and the array substrate is avoided, and accordingly a position deviation between an opposed substrate and the array substrate is avoided. Thus, a light leakage caused by the position deviation between the opposed substrate and the array substrate is prevented.

The spacer not only plays a role of maintaining a cell thickness between the opposed substrate and the array substrate, but also plays a role of maintaining a thickness uniformity of the display device formed by assembling the opposed substrate and the array substrate. In the case that the position deviation occurs during assembling the array substrate and the opposed substrate, the thickness of the display device will become nonuniform. In the embodiments of the disclosure, by forming the spacer on the array substrate, the cell thickness between the opposed substrate and the array substrate maintains uniform, and accordingly a display effect of the display device is improved.

For example, the passivation layer covers the switch unit.

For example, the passivation layer and the spacer are integrally formed of an organic resin material.

The organic resin material has a good dielectric property and is suitable for forming the passivation layer.

For example, the forming the passivation layer on the base substrate and the forming the spacer corresponding to the switch unit comprises: forming a thin film made of a positive or negative organic resin material on the base substrate; exposing the thin film by using a gray-tone mask or a halftone mask, and performing a developing process to form the passivation layer covering the base substrate and the spacer corresponding to the switch unit.

In the case that the passivation layer and the spacer are formed by a single patterning process as described above, the number of patterning processes is reduced, the fabrication process is simplified and the fabrication cost is reduced.

For example, the method of fabricating the array substrate according to the embodiments of the disclosure comprises the following steps.

S101: forming a metal thin film on the base substrate 10, and forming a gate electrode 201 by a patterning process, as shown in FIG. 1.

For example, a gate line and a gate line lead are further formed in this step.

It should be noted that, all the accompanying drawings of the disclosure are simplified schematic views of the array substrate and are merely used to clearly describe embodiments of the disclosure, and the other portions of the array substrate irrelevant to the embodiments of the disclosure are not illustrated or only partially illustrated in the accompanying drawings.

For example, the metal thin film with a thickness of 1,000 Å to 7,000 Å is formed on a glass substrate by using a magnetron sputtering method. The metal thin film is made of metals such as molybdenum, aluminum, aluminum nickel alloy, molybdenum tungsten alloy, chromium, copper, or a combination thereof. After the metal thin film is formed, the patterning process is performed on the metal thin film through exposing, developing, etching and peeling by using a mask to form the gate electrode 201, the gate line and the gate line lead on the base substrate.

Figure 2:
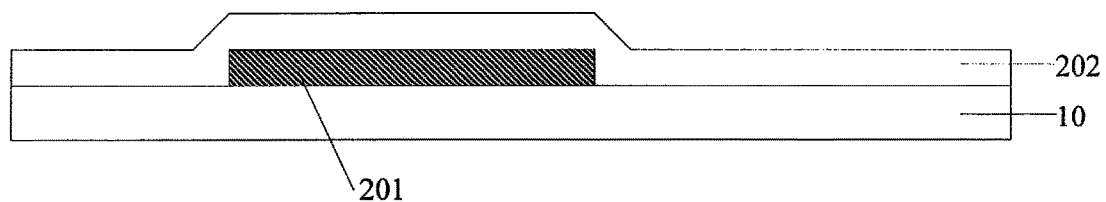

S102: forming a gate insulation layer 202 on the substrate after the step S101, as shown in FIG. 2.

For example, the gate insulation layer 202 with a thickness of 1,000 Å to 6,000 Å is deposited on the base substrate by a chemical vapor deposition method, and the gate insulation layer 202 is formed of silicon nitride. In addition, for example, the gate insulation layer 202 is made of silicon oxide, silicon oxynitride and the like.

Figure 3:
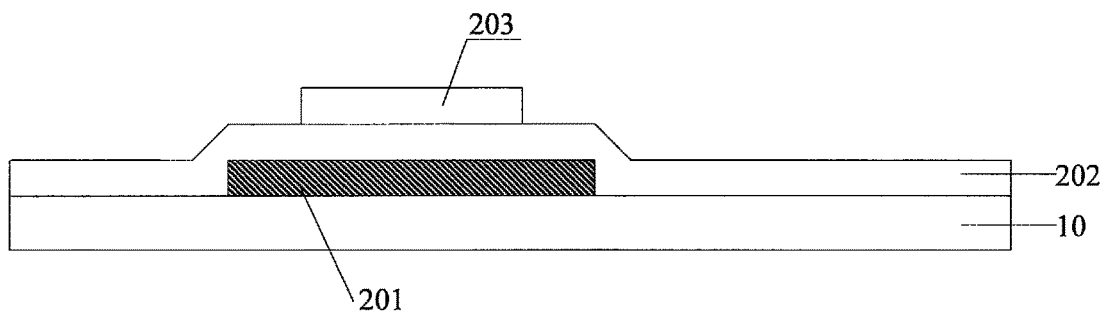

S103: forming an active layer thin film on the base substrate after the step S102 and forming an active layer 203 by a patterning process, as shown in FIG. 3.

For example, a metal oxide semiconductor thin film with a thickness of 1,000 Å to 6,000 Å is deposited on the base substrate by using a chemical vapor deposition method, and then a patterning process is performed on the metal oxide semiconductor thin film through exposing, developing, etching, and peeling by using a mask, to form the active layer 203 on the base substrate.

Figure 4:
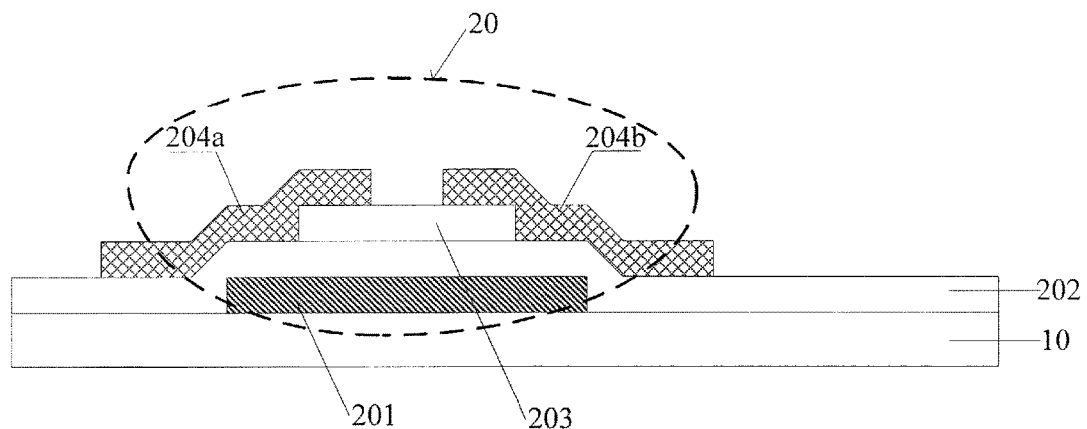

S104: forming a metal thin film on the base substrate after the step S103 and forming a source electrode 204a and a drain electrode 204b by a patterning process, as shown in FIG. 4.

For example, a data line and a data line lead are further formed in this step.

For example, a metal thin film with a thickness of 1,000 Å to 7,000 Å is deposited on the substrate, then a patterning process is performed on the metal thin film through exposing, developing, etching and peeling by using a mask to form the source electrode 204a, the drain electrode 204b, the data line and the data line lead on the base substrate.

After the above steps S101-S104, the switch unit 20 is formed, i.e., the switch unit 20 comprises the gate electrode 201, the gate insulation layer 202, the active layer 203, the source electrode 204a and the drain electrode 204b.

It should be noted that, the switch unit 20 formed in the above steps S101-S104 is of a bottom-gate type structure. However, the embodiments of the disclosure are not limited thereto, and the switch unit 20 may be of a top-gate type structure.

Figure 5:
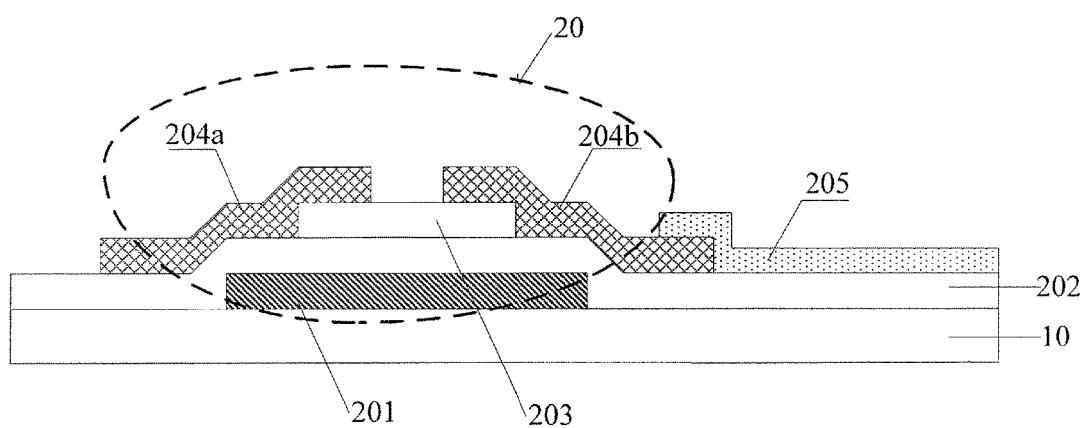

S105: forming a transparent conductive film on the base substrate after the step S104 and forming a pixel electrode 205 by a patterning process, wherein the pixel electrode 205 and the drain electrode 204b are connected electrically, as shown in FIG. 5.

For example, the transparent conductive thin film with a thickness of 100 Å to 1,000 Å A is deposited on the entire base substrate by using a chemical vapor deposition method. For example, the transparent conductive thin film is an Indium Tin Oxides (ITO) or Indium Zinc Oxide (IZO) thin film. Then, a patterning process is performed on the transparent conductive thin film through exposing, developing, etching and peeling by using a mask, to form the pixel electrode 205 on the base substrate.

Figure 6:
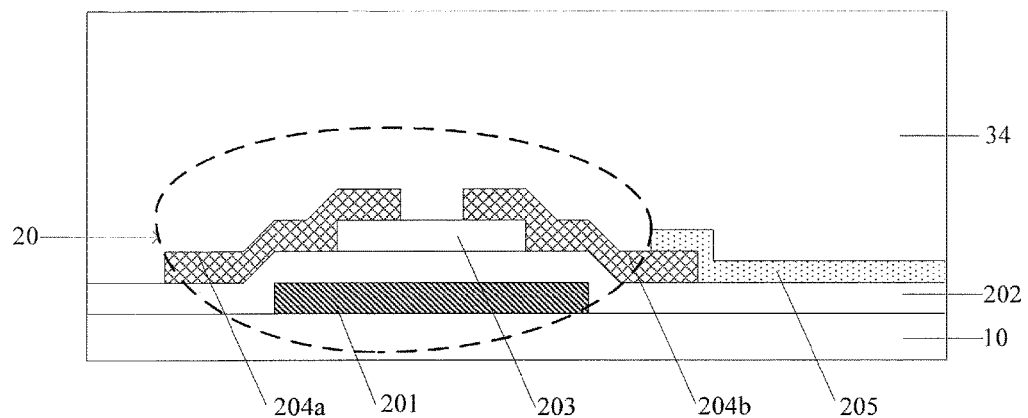

S106: forming an organic resin thin film 34 on the base substrate after the step S105, as shown in FIG. 6.

For example, the organic resin thin film with a thickness of 3.5-4.2 μm, which is selected according to the product design requirements, is coated on the base substrate.

For example, a positive organic resin thin film with a thickness of 4.0 μm is coated on the base substrate to serve as the organic resin thin film 34.

Figure 7:
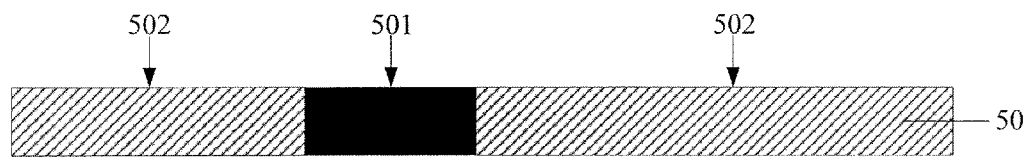
Figure 7:
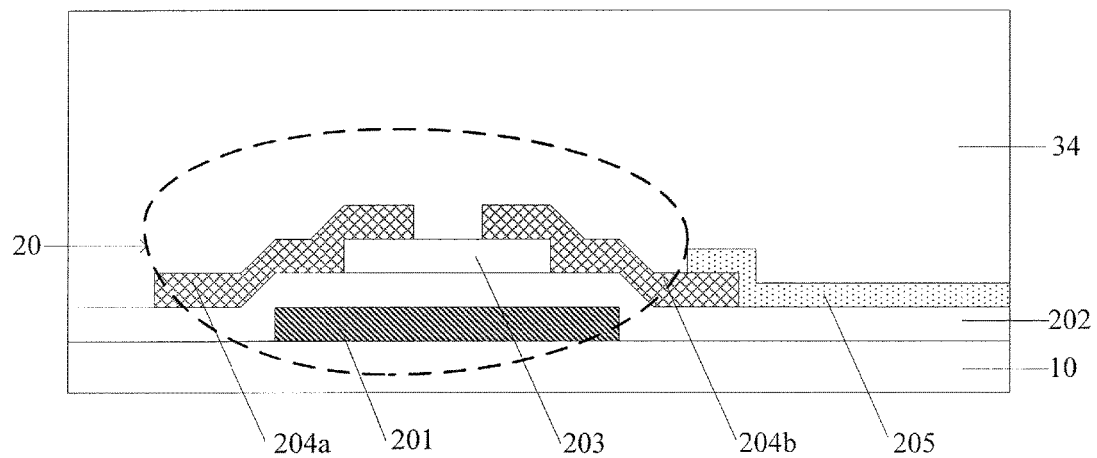
Figure 8:
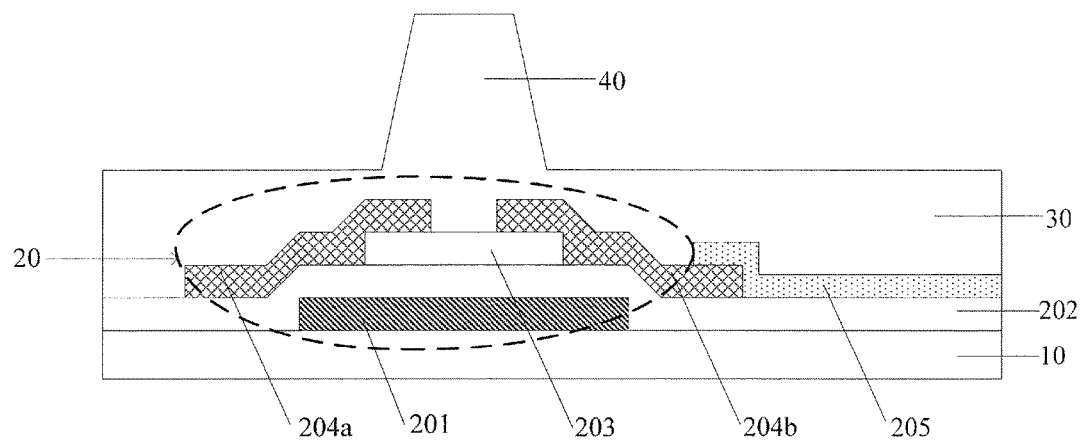
FIG. 8 is a structural schematic view illustrating an array substrate according to embodiments of the disclosure.

S107: forming the passivation layer 30 and the spacer 40 as shown in FIG. 8 on the base substrate after the step S106 by performing a patterning process on the organic resin thin film 34 by using a gray-tone mask 50 shown in FIG. 7, wherein the spacer 40 corresponds to the switch unit 20.

With reference to FIG. 7, the principle of the gray-tone mask 50 is described below.

The gray-tone mask 50 enables that different regions have different transmittances during the exposing process by a grating effect, so that the photoresist is selectively exposed and developed. The gray-tone mask 50 comprises an opaque portion 501 and a translucent portion 502, and the opaque portion 501 corresponds to a region where the spacer 40 to be formed. A transmittance of the translucent portion 502 is determined according to the thickness of the passivation layer 30 to be formed.

Here, for example, taking a normal display device as an example, its spacer 40 has a height of about 3.5 μm, and its passivation layer 30 has a thickness of about 0.6 μm. Thus, the transmittance of the translucent portion 502 of the gray-tone mask 50 is set as about 85% (3.5/4.1), so that the passivation layer 30 with the thickness of about 0.6 μm and the spacer 40 with the height of about 3.5 μm are formed after the patterning process.

This step may use a halftone mask instead of the gray-tone mask, and the principle of the halftone mask is similar to that of the gray-tone mask 50, which will not be repeated here.

Moreover, in step S106, the organic resin thin film 34 may be of a negative organic resin, and in this case, the gray-tone mask 50 comprises a transparent portion and a translucent portion, the transparent portion corresponds to the region where the spacer 40 to be formed, and the transmittance of the translucent portion 502 is determined according to the thickness of the passivation layer 30 to be formed.

Further, the array substrate according to the embodiments of the disclosure is applicable to a liquid crystal display device of an Advanced-Super Dimensional Switching (ADS) mode, an in-plane switching mode and so on. In the ADS-mode liquid crystal display device, a multi-dimensional electric field is formed with both an electric field generated at edges of slit electrodes in a same plane and an electric field generated between a slit electrode layer and a plate-like electrode layer, so that liquid crystal molecules at all orientations, which are located directly above the electrodes or between the slit electrodes in a liquid crystal cell, can be rotated, In this way, the work efficiency of liquid crystal can be enhanced and the light transmittance can be increased. The ADS mode can improve the image quality of the thin film transistor liquid crystal display and has advantages of high transmittance, wide viewing angle, high aperture ratio, low chromatic aberration, high response speed, free of push Mura, etc.

Figure 9:
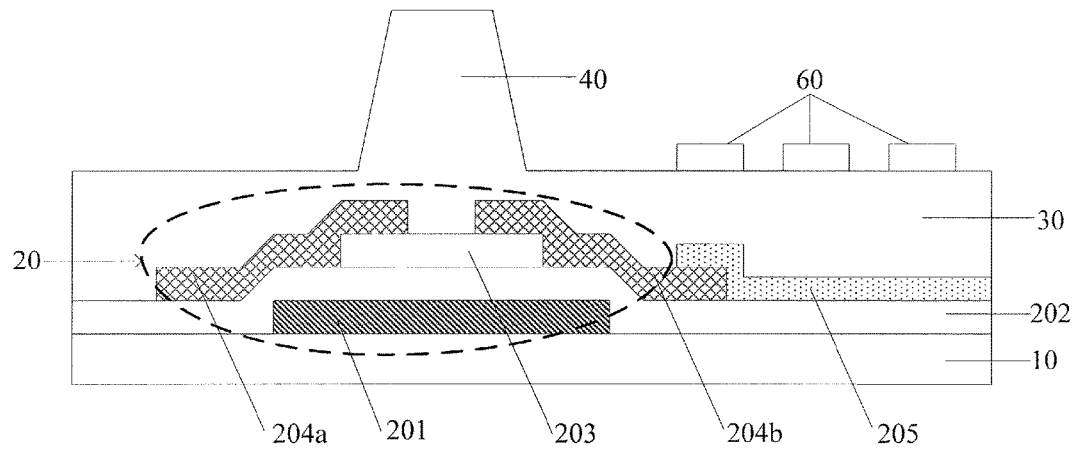
FIG. 9 is a structural schematic view illustrating another array substrate according to embodiments of the disclosure.

In the case that the array substrate is used to the display device of ADS mode, the method further comprises the following steps after the step S107:

S108: forming a transparent conductive thin film on the base substrate after the step S107 and forming a common electrode 60 by a patterning process, as shown in FIG. 9.

It should be noted that, in the above description, the passivation layer and the spacer are simultaneously made of the same material. However, the embodiments of the disclosure are not limited thereto, the passivation layer and the spacer may be made of different materials, and the passivation layer and the spacer may be formed separately by different patterning processes.

It should be noted that, in the above description, the passivation layer and the spacer are made of the organic resin material. However, the embodiments of the disclosure are not limited thereto, and the passivation layer and the spacer may be made of other materials capable of being patterned.

It should be noted that, in the above description, the passivation layer and the spacer directly contact each other. However, the embodiments of the disclosure are not limited thereto, and other layers may be inserted between the passivation layer and the spacer so that the passivation layer and the spacer do not directly contact each other.

It should be noted that, the method of fabricating the array substrate according to the embodiments of the disclosure is not limited to comprise the above-described steps. The method may further comprise other steps and the above-described steps may be performed in other different orders, as long as the switch unit, the passivation layer, and the spacer corresponding to the switch unit are formed on the base substrate.

The embodiments of the disclosure provide the method of fabricating the array substrate, the method comprises: forming the thin film transistor switch unit comprising the gate electrode, the gate insulation layer, the active layer, the source electrode and the drain electrode; forming the pixel electrode; forming the passivation layer; forming the spacer corresponding to the switch unit; and forming the common electrode. On the one hand, by forming the spacer on the array substrate, the position deviation between the spacer and the array substrate is avoided, and accordingly the position deviation between the opposed substrate and the array substrate is avoided. Thus, the light leakage caused by the position deviation between the opposed substrate and the array substrate is prevented, the thickness of the display device becomes more uniform, and the display effect of the display device is improved. On the other hand, the ADS-mode array substrate has advantages of high transmittance, wide viewing angle, high aperture ratio, low chromatic aberration, high response speed, free of push Mura, etc.

In addition, the embodiments of the disclosure further provide an array substrate. As shown in FIG. 8 and FIG. 9, the array substrate comprises a base substrate 10 and a switch unit 20 disposed on the base substrate. The array substrate further comprises: a passivation layer 30 disposed on the base substrate and a spacer 40 disposed on the passivation layer. The spacer 40 corresponds to the switch unit 20.

For example, the switch unit 20 is a thin film transistor and comprises a gate electrode 201, a gate insulation layer 202, an active layer 203, a source electrode 204*a* and a drain electrode 204*b*.

It should be noted that, "the spacer 40 corresponding to the switch unit 20" as described herein means that the spacer 40 is provided above the switch unit 20 as viewed from a direction perpendicular to the array substrate.

The embodiments of the disclosure provide the array substrate, and the array substrate comprises: the switch unit 20 disposed on the base substrate, the passivation layer 30, and the spacer 40 disposed on the passivation layer and corresponding to the switch unit. Since the spacer 40 is provided on the array substrate, the position deviation between the spacer and the array substrate is avoided, and accordingly the position deviation between the opposed substrate and the array substrate is avoided. Thus, the light leakage caused by the position deviation between the opposed substrate and the array substrate is prevented, the thickness of the display device becomes more uniform, and the display effect of the display device is improved.

For example, the passivation layer 30 and the spacer 40 are made of an organic resin material.

The organic resin material has a good dielectric property and is suitable for forming the passivation layer. In the case that the passivation layer 30 and the spacer 40 are made of organic resin material, the passivation layer 30 and the spacer 40 may be formed by a single patterning process. Thus, the number of the patterning processes is reduced, the fabrication process is simplified and the fabrication cost is saved.

For example, the array substrate further comprises a common electrode.

The embodiments of the disclosure provide the array substrate, and the array substrate comprises: the switch unit 20 disposed on the base substrate, the passivation layer 30, the spacer 40 disposed on the passivation layer and corresponding to the switch unit, and the common electrode 60. On the one hand, by forming the spacer on the array substrate, the position deviation between the spacer and the array substrate is avoided, and accordingly the position deviation between the opposed substrate and the array substrate is avoided. Thus, the light leakage caused by the position deviation between the opposed substrate and the array substrate is prevented, the thickness of the display device becomes more uniform, and the display effect of the display device is improved. On the other hand, the ADS-mode array substrate has advantages of high transmittance, wide viewing angle, high aperture ratio, low chromatic aberration, high response speed, free of push Mura, etc.

The embodiments of the disclosure further provide a display device, and the display device comprises any of the above-described array substrates.

The display device may be a liquid crystal display, a liquid crystal television, a digital photo frame, a mobile phone, a tablet personal computer or any other products or components with a display function.

The foregoing embodiments merely are exemplary embodiments of the disclosure; however, the protection scope of the disclosure is not limited thereto, and any skilled in the art can easily think of, within the technical scope disclosed by the disclosure, variation or substitution, which should fall within the protection scope of the disclosure. Accordingly, the scope of the disclosure is determined by the appended claims.

What is claimed is:

1. An array substrate, comprising:
a base substrate;
a thin film transistor disposed on the base substrate and comprising a gate electrode, a gate insulation layer, an active layer, a source electrode and a drain electrode;
a pixel electrode disposed on the gate insulating layer and at least partially overlapping with the drain electrode;
a passivation layer disposed on the thin film transistor and the pixel electrode and covering the whole base substrate; and
a spacer integrated with the passivation layer and projecting outwardly from the passivation layer at a region directly above the gate electrode,
wherein the array substrate further comprises a common electrode, the common electrode directly contacts the passivation layer but does not directly contact the spacer, and the common electrode comprises a plurality of strip electrodes.

2. The array substrate according to claim 1, wherein the passivation layer and the spacer are made of an organic resin material.

3. The array substrate according to claim 1, wherein the thin film transistor is of a bottom-gate type or a top-gate type.

4. The array substrate according to claim 1, wherein the passivation layer covers the thin film transistor.

5. A display device, comprising an array substrate according to claim 1.

6. The array substrate according to claim 1, wherein the spacer covers a portion of the drain electrode and a portion of the source electrode.

7. The array substrate according to claim 1, wherein the pixel electrode directly contacts the gate insulating layer.

8. The array substrate according to claim 1, wherein the passivation layer directly contacts the thin film transistor.

9. A method of fabricating an array substrate, comprising:
forming a thin film transistor on a base substrate, the thin film transistor comprising a gate electrode, a gate insulation layer, an active layer, a source electrode and a drain electrode;
forming a pixel electrode on the gate insulation layer, the pixel electrode at least partially overlapping with the drain electrode;
forming a passivation layer on the thin film transistor and the pixel electrode to cover the whole base substrate; and
forming a spacer integrated with the passivation layer and projecting outwardly from the passivation layer at a region directly above the gate electrode,
wherein the method further comprises: forming a common electrode on the base substrate, the common electrode directly contacts the passivation layer but does not directly contact the spacer, and the common electrode comprises a plurality of strip electrodes.

10. The method according to claim 9, wherein the passivation layer and the spacer are made of an organic resin material.

11. The method according to claim 9, wherein the forming the passivation layer and forming the spacer comprises:
forming a thin film made of a positive or negative organic resin material on the base substrate;
exposing the thin film by using a gray-tone mask or a halftone mask, and performing a developing process to form the passivation layer covering the base substrate and the spacer.

12. The method according to claim 9, wherein the thin film transistor is of a bottom-gate type or a top-gate type.

13. The method according to claim 9, wherein the passivation layer is formed to cover the switch unit.

14. The method according to claim 9, wherein the spacer covers a portion of the drain electrode and a portion of the source electrode.

15. The method according to claim 9, wherein the pixel electrode directly contacts the gate insulating layer.

16. The method according to claim 9, wherein the passivation layer directly contacts the thin film transistor.

* * * * *